United States Patent [19]

Stewart et al.

[11] 4,419,741
[45] Dec. 6, 1983

[54] READ ONLY MEMORY (ROM) HAVING HIGH DENSITY MEMORY ARRAY WITH ON PITCH DECODER CIRCUITRY

[75] Inventors: Roger G. Stewart, Neshanic Station, N.J.; Moshe Mazin, Scotia, N.Y.

[73] Assignee: RCA Corporation, New York, N.Y.

[21] Appl. No.: 299,343

[22] Filed: Sep. 4, 1981

Related U.S. Application Data

[63] Continuation-in-part of Ser. No. 116,313, Jan. 28, 1980, abandoned.

[51] Int. Cl.³ .................... G11C 5/06; G11C 17/06
[52] U.S. Cl. .................................. 365/72; 365/105
[58] Field of Search ............... 365/63, 72, 94, 103, 365/104, 105

[56] References Cited

U.S. PATENT DOCUMENTS

| 3,671,948 | 6/1972 | Cassen et al. | 365/105 |
|---|---|---|---|
| 3,774,170 | 11/1973 | Koch | 340/173 |
| 3,909,808 | 9/1975 | Cochran et al. | 365/104 |
| 3,965,568 | 6/1976 | Gooch | 29/583 |
| 4,069,427 | 1/1978 | Masuda | 365/104 |
| 4,088,546 | 5/1978 | Wu et al. | 204/15 |
| 4,124,900 | 11/1978 | Smith et al. | 365/72 |
| 4,151,020 | 4/1979 | McElroy | 148/187 |
| 4,163,242 | 6/1979 | Stein | 357/41 |

FOREIGN PATENT DOCUMENTS

| 2255529 | 1/1976 | Fed. Rep. of Germany . | |
| 2850864 | 5/1979 | Fed. Rep. of Germany | 365/105 |
| 981735 | 1/1965 | United Kingdom . | |

OTHER PUBLICATIONS

P. C. Arnett et al., Nonvolatile Diode Cross-Point Memory Array, IBM Tech. Discl. Bul., vol. 17, No. 2, Jul. 1974, p. 365.

H. Kawagoe et al., Minimum Size ROM Structure Compatible with Silicon-Gate E/D MOS LSI, IEEE Journal of Solid-State Circuits, vol. SC-11, No. 3, Jun. 1976, pp. 360-364.

L. Boysel, Memory on a Chip: A Step Toward Large-Scale Integration, Electronics, Feb. 6, 1967, pp. 93-98.

K. Clark, Jr., et al., Electron-Beam Stitching Technique for Use in the Fabrication of Integrated Circuit Devices, IBM Tech. Discl. Bul., vol. 23, No. 7A, Dec. 1980, pp. 2774-2775.

S. —Y. Wu, A Hybrid Mass-Interconnection Method by Electroplating, IEEE Transactions on Electron Devices, vol. ED-25, No. 10, Oct. 1978, pp. 1201-1203.

*Primary Examiner*—Stuart N. Hecker
*Attorney, Agent, or Firm*—Birgit E. Morris; Donald S. Cohen

[57] ABSTRACT

The ROM utilizes a diode x-y memory array which can be comprised of a number of suitable materials which form rectifying junctions. The diodes are formed vertically in order to provide a very high density array. On pitch decoder circuitry which is capable of matching the high density of the memory cells in the x-y memory array is also described, as is a unique apparatus for joining adjacent ends of conductive lines which are spaced very close together without increasing their pitch.

8 Claims, 7 Drawing Figures

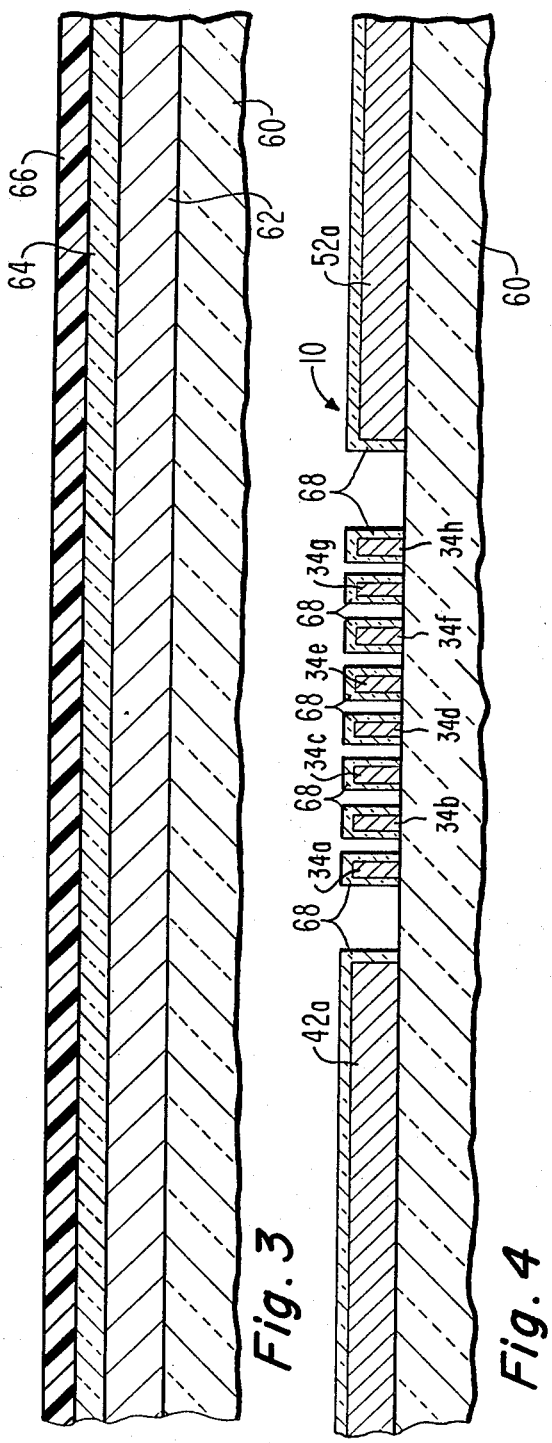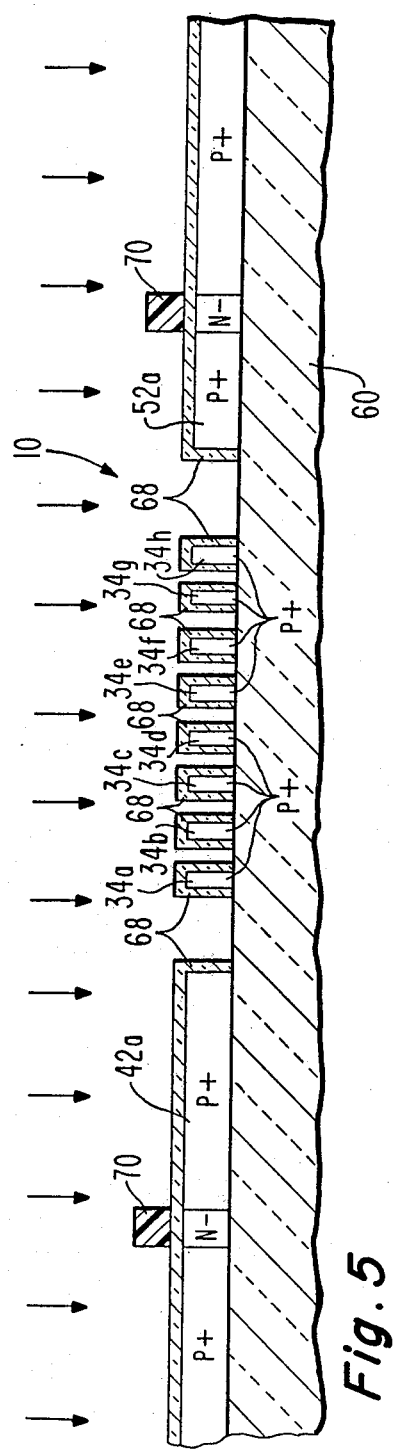

READ ONLY MEMORY (ROM) HAVING HIGH DENSITY MEMORY ARRAY WITH ON PITCH DECODER CIRCUITRY

This is a continuation-in-part of our application Ser. No. 116,313, filed Jan. 28, 1980 (now abandoned).

BACKGROUND OF THE INVENTION

The present invention relates to integrated circuit Read Only Memories (ROMs) and to Programmable Logic Arrays (PLAs).

ROMs and PLAs are respectively used in electronic circuitry to store information and to execute logic functions. In particular, they are used in digital equipment, including minicomputers and microprocessor systems. In order to increase the economy of manufacturing ROMs and PLAs and to decrease the size of the overall systems which employ them, it is advantageous to have the greatest possible number of memory bits per integrated circuit chip. Accordingly, it is desirable to decrease the area used for each storage cell, a storage cell being the portion of the integrated circuit which stores a single bit of information. The storage cells are generally arranged in an x-y memory array with decoder circuitry situated along the x-axis of the memory array to select a particular column of storage memory cells and additional decoder circuitry situated along the y-axis of the array to select a particular row of memory cells, such that the intersection of the decoded row and the decoded column yields a particular bit of information to be accessed.

The size of the storage cells within the memory array determines the packing density of cells in either the x or the y direction, i.e. how closely adjacent rows and columns of memory cells can be placed. The spacing is called the "pitch" of the array. It should be noted that the "pitch" of the rows may differ from the "pitch" of the columns depending upon the manner in which the memory array is implemented and the particular design rules which are used.

As used herein, the term "design rules" refers to the rules which define the dimensions of the minimum line width and the minimum line spacing which can be reliably achieved by the technology in use.

While the present invention relates both to ROMs and to PLAs, hereafter the discussion will be substantially limited to ROMs. Those skilled in the art will recognize that the disclosure covers PLAs as well.

Heretofore, ROMs were commonly implemented by using an MOS transistor for each memory cell with the MOS transistor being biased into either a conducting or a non-conducting state. The layout of memory arrays using such prior cells required the presence of contact areas between a metal layer and an underlying epitaxial silicon line. Such metal-to-silicon contacts added to the memory array size, which directly affected the chip size. This was not previously a problem, between the ultimate limitation on the pitch of the rows and columns of cells in the memory array was not usually determined by the size of the memory cells, but by the size of the decoding circuitry located adjacent the x and y edges of the memory array.

It is desirable to maintain the decoder circuitry "on pitch" with the rows and columns of the memory array for reasons well known in the art. Accordingly, it is desirable to reduce the size of the decoder circuitry in order to have the decoders match the pitch of the cells in the memory array, thereby decreasing the ultimate size of the chip. In view of the fact that decoder circuitry requires a number of gates, and each gate requires a number of transistors, the pitch of the decoder circuitry heretofore available was much greater than the pitch with which the cells in the memory array could be arranged. Thus, much of the efforts heretofore made in ROM development involved designs for decreasing the space required by the decoder circuitry.

By way of example, a U.S. patent application entitled POWER GATED DECODING was filed as Ser. No. 044,363 on June 1, 1979, now U.S. Pat. No. 4,344,005, by Roger Green Stewart one of the inventors of the present invention. That particular patent application, which is incorporated herein by reference, describes circuitry having a matrix decoder in which the size of the final stage of the decoder circuitry is reduced with respect to conventional circuitry by using the power supply to individual gates as one of the inputs to those gates. Thus, area is saved in the decoder circuitry which makes the decoder circuitry smaller than it would conventionally be. That helps in placing the decoder circuitry "on pitch" with the cells in the memory array.

The inventors have found a way to increase the effective pitch of the memory cells. In a ROM the increase would be by successive powers of two. However, in PLAs the increase could be by any arbitrary number. Their method can be employed to substantially increase the effective pitch of the memory cells in the array, i.e. for ROMs by a power of 2, a power of 4, a power of 8, etc.

In addition, the inventors have designed a new memory array in which the memory cells can occupy the minimum space allowed by the design rules in use. Thus, the combination of their new memory array with their new method of increasing the effective pitch of memory cells in the array yields a ROM in which the decoder circuitry can be built of conventional devices, yet the completed chip will have many more memory cells than a conventionally built ROM that utilized the same chip area.

SUMMARY OF THE INVENTION

In accordance with the present invention, a memory array along with associated decoding apparatus are described. The memory array is comprised of a series of minimum width, parallel, oxide covered silicon epitaxial lines in which the minimum spacing between adjacent lines allowed by the design rules is used. Underlying and orthagonal to the epitaxial silicon lines are a series of minimum width, parallel, doped polycrystalline silicon lines. The epitaxial silicon lines are all doped to have the same conductivity type, and the polycrystalline silicon lines are all doped to have the opposite conductivity type. The number of intersections, viewed from the top, of the polycrystalline silicon lines with the epitaxial silicon lines will be the product of the number of epitaxial silicon lines, "n", multiplied by the number of polycrystalline silicon lines, "m". Thus, there will be "n" times "m" intersections. At each intersection, a "buried contact" diode can be formed by removing the oxide from the epitaxial silicon line prior to depositing the polycrystalline silicon line thereon. The memory array is therefore comprised of a series of intersections which may selectively be programmed to have either a diode or an open between a given polycrystalline silicon line and the underlying epitaxial silicon line. The memory array therefore requires the minimum space allowed within the design rules for a maximum number of storage cells.

In order to detect the presence or absence of a diode at a particular intersection, an attempt is made to pass current down a selected polycrystalline silicon line and to sense that current out of a selected epitaxial silicon line. If the attempt is successful, it means that a diode is present at the intersection. On the other hand, if the attempt is not successful, then no diode is present at the intersection. As will be obvious to those skilled in the art, the attempt to pass current is made consistent with the polarity of the buried contact diodes which may be present.

Design rules which require a minimum epitaxial silicon line ("bit line") width of 7 microns and a minimum line spacing of 4 microns determine that the column pitch of cells in the memory array can be as small as 11 microns. Similarly, a minimum polycrystalline silicon line ("word line") width of 3 microns with a minimum line space of 4 microns between polycrystalline silicon lines determine that the row pitch of cells in the memory array can be as small as 7 microns.

In view of the fact that heretofore there was no known way of building a decoder to match a row pitch of 7 microns, the high density buried contact memory array described above would not be useful in the manufacture of a high density ROM without the unique multi-stage decoder circuit designed by the inventors.

As is understood by those skilled in the art, the function of the decoders in a ROM is to select a particular bit from the memory array. That is generally accomplished in the manner heretofore described. Typically, the total number of bits in a ROM is a factor of 2, so that an individual bit can be selected by specifying its address as a binary number. In particular, the total number of bits in the memory array, namely "n" times "m", is usually equal to $2^k$, where k is the number of bits in the binary address available to specify the particular memory location which is to be read. Typically, both "n" and "m" are also powers of 2. Thus, if n is equal to $2^i$ then m is equal to $2^{(k-i)}$.

In order to select a particular memory location for reading from the memory array, one of $2^i$ rows, each having $2^{(k-i)}$ columns, is selected. Then, one of the $2^{(k-i)}$ columns is selected to address the desired bit. A common method of selecting a desired bit is to have one line selector one of the $2^i$ word lines and another line selector select one of the $2^{(k-i)}$ bit lines. Thus, a "1 of $2^{i}$" line selector is typically used as the word line decoder and a "1 of $2^{(k-i)}$" line selector is typically used as the bit line decoder. In view of the fact that a "1 of $2^{i}$" line selector is generally implemented by using $2^i$ i-input NAND gates and i inverters, there is no known way of manufacturing a 1 of $2^i$ line selector with a 7 micron pitch (for any given value of i). It would be particularly useful if the effective pitch of the memory array could be some multiple of 7 microns. In accordance with the present invention, the effective row pitch of cells in the memory array can be an arbitrary factor of two multiplied by 7 microns, i.e. 14 microns, 28 microns, 56 microns, etc. In view of the fact that the inventors can build a word decoder having a pitch of 28 microns with a final stage which converts the 7 micron row pitch into a 28 micron pitch while simultaneously providing a 1 of 4 output, it is possible to produce a memory chip having a very high density of memory cells which are matched by associated decoder circuitry. Similarly, the effective column pitch can be increased by any desired power of 2.

BRIEF DESCRIPTION OF THE DRAWING

In the Drawing:

FIGS. 3-7 are cross-sectional views, taken along the line 3—3 of FIG. 2, illustrating the manner in which the ROM is manufactured.

DETAILED DESCRIPTION OF AN EXEMPLARY EMBODIMENT

Figure 1:
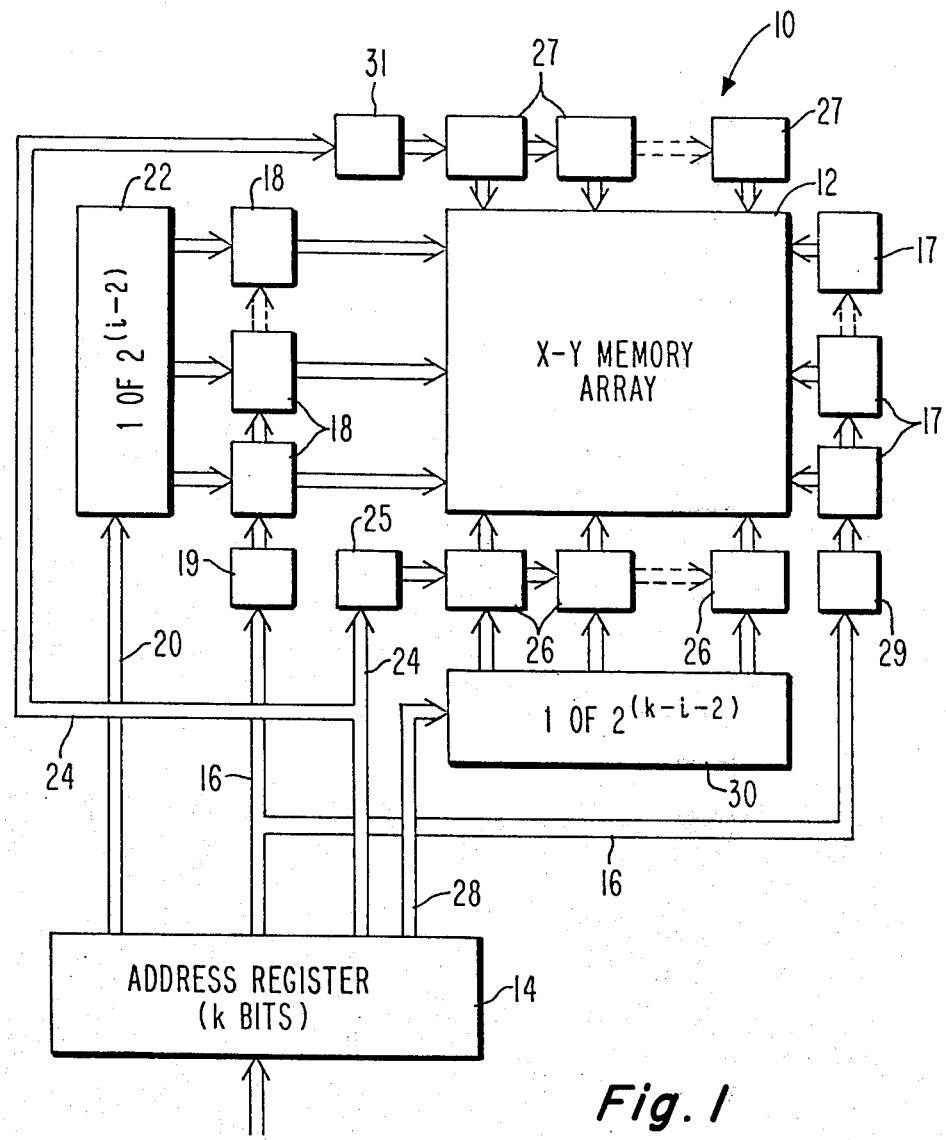
FIG. 1 is a block diagram of the ROM of the present invention.

Referring now to FIG. 1, a block diagram of the ROM 10, constructed in accordance with the present invention is shown. The ROM 10 comprises an x-y memory array 12 of $2^k$ memory cells, having $2^i$ word lines and $2^{(k-i)}$ bit lines. In order to extract a single bit of information from the x-y memory array 12, both the bit line and the word line associated with a particular memory cell in the x-y memory array 12 must be addressed. Accordingly, an address comprising k bits must be fed into an address register 14. From the address register 14, 2 bits are extracted and placed on a word decode line 16 which is connected to a word address decoder 19. The word address decoder 19 is connected to a series of word predecoders or word line selectors 18. The word line selectors 18, as used in the preferred embodiment of the invention, are each 1 of 4 line selectors of a type which will be described hereinafter. The word line selectors 18 can be designed in a manner which provides for a 1 of 4 line selection within the 28 micron pitch previously discussed, as will be more fully described hereinafter.

From the address register 14, i−2 bits are connected via a word decode line 20 to a word decoder 22. The word decoder 22 is a 1 of $2^{(i-2)}$ line selector. The function of the word decoder 22 is to select one of the word line selectors 18. Each of the word line selectors 18 of this particular embodiment is connected to 4 word lines of the x-y memory array 12. Based upon the 2 bits on the word predecode line 16, the word address decoder 19 causes each of the word predecoders 18 to select one of the 4 word lines to which they are connected. The word decoder 22 simultaneously selects one of the word predecoders 18. Accordingly, i bits are used to select one of the $2^i$ word lines in the x-y memory array 12.

Similarly, 2 bits from the address register 14 are sent via a bit predecode line 24 to a bit address decoder 25. The bit address decoder 25 is connected to a series of bit predecoders or bit line selectors 26. Each of the bit line selectors 26 is a 1 of 4 line selector connected to 4 bit lines in the embodiment described. The remaining k−i−2 bits in the address register 14 are sent on a bit decode line 28 from the address register to the bit decoder 30 which is a 1 of $2^{(k-i-2)}$ line selector. Accordingly, k−i bits of the address are used to select one of the $2^{(k-i)}$ bit lines present in the x-y memory array 12.

In accordance with the above decoding description, k bits placed into the address register 14 are used to select one of the $2^k$ memory cells present in the x-y memory array 12. The purpose of the line selectors 18, 26 is to match the pitch of the decoders 22, 30 to the pitch of the x-y memory array 12 while simultaneously assisting in the decoding process. As discussed above, the line selectors 18, 26 of this embodiment are 1 of 4 line selectors. However, it should be obvious to those of ordinary skill in the art that the line selectors 18, 26 can be 1 of 8 line selectors or 1 of 16 line selectors. In fact, for Programmable Logic Arrays (PLAs), the predecoders can be 1 of j line selectors, for any integer value of j, i.e. not necessarily a power of 2. Accordingly, the line selectors 18, 26, which are 1 of 4 line selectors as described herein, should be considered to be representative rather than exhaustive.

Similar to the line selectors 18, 26, there are word line deselectors 17 and bit line deselectors 27, which are connected to the same word lines and bit lines as associated word line selectors 18 and bit line selectors 26. The function of the deselectors 17, 27 is to disable the 3 of 4 lines which are not connected to the memory cell being addressed. The word line deselectors 17, 27 are connected to the word decode line 16 through a word line deselector address decoder 29, and the bit line deselectors 27 are connected to the bit decode line 24 through a bit line deselector address decoder 31.

Figure 2:
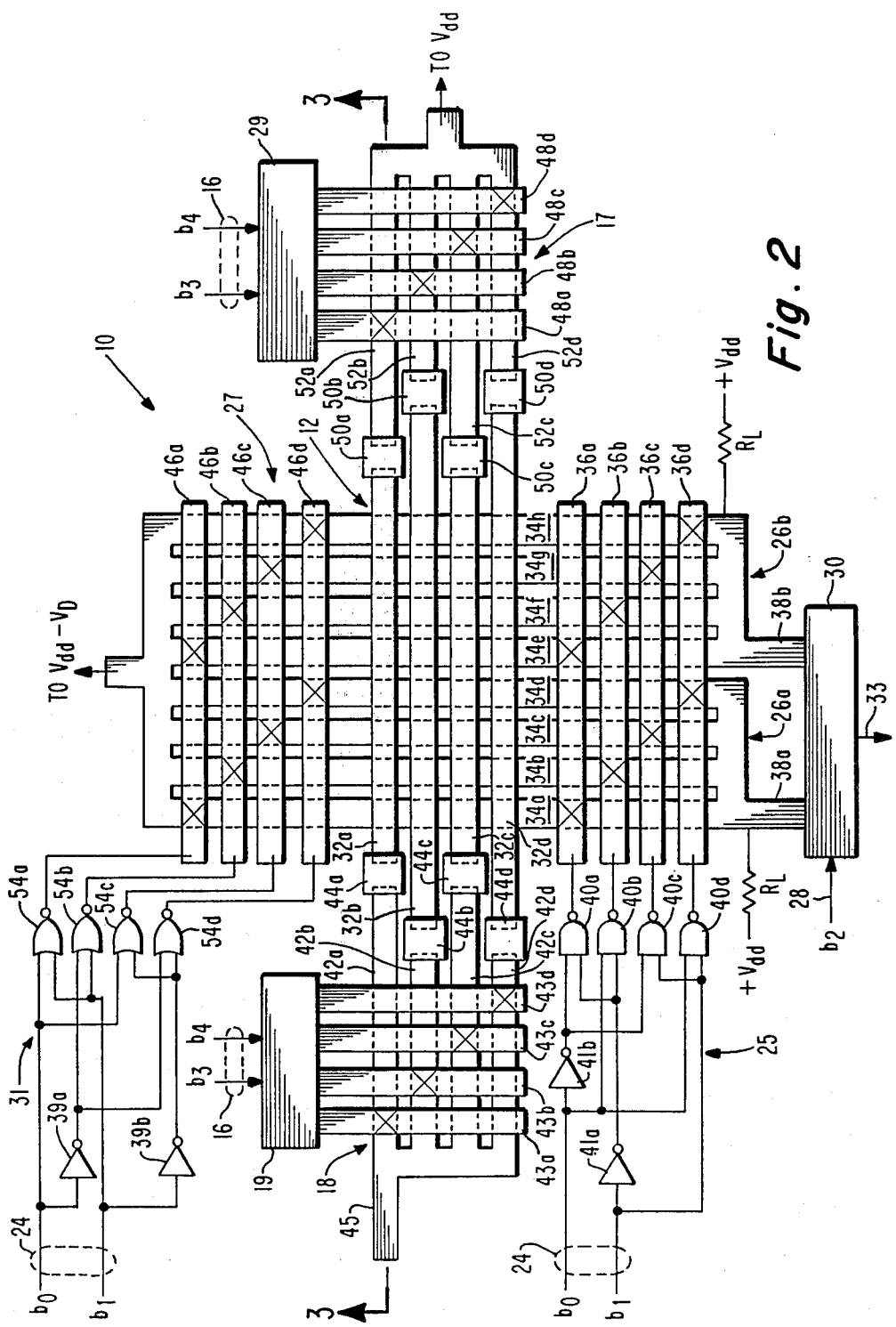
FIG. 2 is a partial schematic and partial plan view of the ROM which describes its memory array and associated features.

Referring now to FIG. 2, a top and partially schematic view of the ROM 10, constructed in accordance with the present invention, is shown. For simplicity of explanation, the memory array 12 is an x-y memory array having 4 word lines 32a-32d and 8 bit lines 34a-34h. The ROM 10, of the preferred embodiment is built using silicon-on-sapphire (SOS) technology in which an epitaxial silicon layer is grown on an insulating substrate, typically of sapphire. The bit lines 34a-34h are comprised of P+ epitaxial silicon, and the word lines 32a-32d are comprised of N+ polycrystalline silicon. When the memory array 12 is built, the epitaxial silicon bit lines 34a-34h are covered with an oxide layer. Typically, a thermal silicon dioxide layer is grown on the bit lines 34a-34h. The memory array 12 is then programmed by removing the oxide, typically by etching in buffered hydrofluoric acid (HF), from those portions of the bit lines 34a-34h where intersections will be formed with the word lines 32a-32d and diodes are desired. Thus, when the polycrystalline silicon word lines 32a-32d are deposited and defined over the epitaxial silicon bit lines 34a-34h, there will be diodes formed by contact between the word lines 32a-32d and the bit lines 34a-34h at particular intersections. The particular intersections where diodes are formed correspond to the data programmed into the ROM, as will be obvious to those skilled in the art.

The function of the ROM is to store information in binary form. The ROM operates by indicating the presence or absence of a diode when a particular memory address is selected. As will also be obvious to those skilled in the art, the term "memory address" refers to the binary code which identifies a particular intersection of a word line 32 and a bit line 34, i.e. a particular memory cell.

With continued reference to FIG. 2, the bit lines 34a-34h extend downward beyond the x-y memory array 12 into the bit line selectors 26a, 26b. The address decoder 25 of the particular embodiment shown in FIG. 2 comprises, in part, four NAND gates 40a-40d, which drive the bit line selectors 26a, 26b. The bit line selectors 26a, 26b are comprised of four polycrystalline silicon bit predecoder lines 36a-36d which overlie the bit lines 34a-34h. As described above, the bit lines 34a-34h are comprised of P+ epitaxial silicon lines. However, beneath those intersections indicated by an "x", where a polycrystalline silicon bit predecoder line 36a-36d overlies an epitaxial silicon bit line 34a-34h, the epitaxial silicon bit lines are doped to be of N− conductivity. Accordingly, each bit line selector 26a, 26b acts like a single-pole 4-position switch, if only a single one of the bit predecoder lines 36a-36d has a non-positive potential imposed upon it at a given time. For example, if bit predecoder line 36a is maintained at a non-positive potential while the other bit predecoder lins 36b, 36c, and 36d are kept at the maximun positive chip potential, $V_{dd}$, only bit lines 34a and 34e will be connected to the bit line selector outputs 38a, 38b, respectively. Thus, by suitably energizing the bit predecoder lines 36a-36d, the bit line selectors 26a, 26b will each have a single output line 38a, 38b connected to the x-y memory array 12. In view of the fact that the bit line selectors 26a, 26b can be made with the same geometries and design rules as the x-y memory aray 12, the bit line selectors 26a, 26b can be built with their data input lines, corresponding to the bit lines 34a-34h, "on pitch" with the x-y memory array 12. In the preferred embodiment of the invention, there is a 4-to-1 decrease in the effective pitch of the input bit lines 34a-34h with respect to the pitch of the bit line selector output lines 38a, 38b. Similarly, a 2-to-1 reduction, an 8-to-1 reduction, or any other desired reduction could be made by using the bit line selectors of the present invention.

Once the bit predecoding has been accomplished, an "off pitch" decoding of the bit line selector outputs 38a, 38b can be carried out. In the present embodiment of the invention, it is assumed that a decoder can be built with a pitch four times greater than the column pitch of the x-y memory array 12. Accordingly, further decoding of the bit line selector outputs lines 38a, 38b can easily be accomplished with an effective 4-to-1 pitch reduction.

The bit decoder 25 is comprised of a series of 2 input NAND gates, 40a-40d, whose outputs are connected to the predecoder lines 36a-36d, and a pair of inverters 41a, 41b, whose inputs and outputs are connected to the inputs of the NAND gates 40a-40d. The bit decoder 25 is used to suitably energize the predecoder lines 36a-36d which form the gates of MOS transistors where they intersect the bit lines 34a-34h at the intersections designated by the "x's". The bit decoder 25 requires two bits of the memory address, b0 and b1, to select one of the four bit predecoder lines 36a-36d.

Following the 4-to-1 reduction in the effective pitch of the bit lines 34a-34h to the effective path of the predecoder output lines 38a, 38b, the predecoder output lines 38a, 38b can be decoded by conventional decoder circuitry (indicated by reference numeral 30 in FIG. 2). The bit decoder 30 has a single output line 33. As will be understood by those skilled in the art, the bit decoder 30 of the embodiment shown in FIG. 2 will require 1 bit of the memory address, b2, to select one of the two predecoder output lines 38a, 38b and to connect the selected output line to the decoder output line 33.

Referring now to the word decoding process of the embodiment shown in FIG. 2, those skilled in the art will recognize that is desirable to have the word decoding process conducted in a manner equivalent to the bit decoding process which was just described. However, the same type of decoding circuitry cannot be used because the bit lines 34a-34h of the x-y memory array 12 are epitaxial silicon lines which are formed into the drains, sources, and channel regions of insulated gate field effect transistors in the bit predecoders 26a, 26b in the manner heretofore explained. On the other hand, the word lines are polycrystalline silicon lines which cannot be used to make the drains, sources, and channel regions of insulated gate field effect transistors to form a word line selector of the type used to decoding the bit lines.

In order to remedy that situation, and in order to utilize equivalent circuitry for word selection as was used for bit selection, word line extensions 42a-42d are formed of P+ epitaxial silicon on the same pitch as the word lines 32a-32d. The adjacent ends of the word line extensions 42a-42d and the word lines 32a-32d are joined electrically by staggered metal contacts 44a-44d. The metal contacts 44a-44d are staggered in order to allow them to overlap the width of the word lines 32a-32d and the extensions 42a-42d while taking up the minimum amount of space necessary in the direction in which the word lines 32a-32d and the word line extensions 42a-42d extend. The staggered metal contacts 44a-44d thus provide ohmic contact, yet they do not short out one another. Thus, the staggered metal contacts 44a-44d provide an "on pitch" connection between the polycrystalline silicon word lines 32a-32d and the epitaxial silicon word line extensions 42a-42d, and they make it possible to implement a word line selector in exactly the same manner in which the bit line selectors 26a, 26b were previously implemented. Accordingly, the word line selector 18 makes use of polycrystalline silicon lines 43a-43d in the same manner in which the bit line selectors 26a, 26b made use of the polycrystalline silicon lines 36a-36d. The word line selector 18 is functionally equivalent to the bit line selectors 26a, 26b, so no additional explanation of the word line selector 18 is required. In addition, since there are only four word lines, 32a-32d in the present embodiment of the invention, the word line selector 18 does all of the word decoding, so no additional word line selector is required.

It will be noted that two bits of the memory address, b3 and b4, are used to decode the word lines 32a-32d, to select one of them, and connect it to the word output line 45. The necessary word address decoder 19, which operates in the same manner as the bit address decoder 25, explained heretofore, is schematically represented in FIG. 2. Those skilled in the art will understand that the circuitry of the word address decoder 19 can be identical to the circuitry of the bit address decoder 25.

Based upon the foregoing description of the addressing scheme used to select a particular address in the x-y memory array 12, a 5 bit address is required to address the 32 memory cells in the x-y memory array 12. As will be understood by those skilled in the art, $2^5$ is equal to 32, the number of memory cells in the x-y memory array 12. With reference to FIGS. 1 and 2, it will be seen that the embodiment described in FIG. 2 utilizes 2 bits (b0 and b1) of the 5 bit address for bit line predecoding, 1 bit (b2) of the address for bit line decoding, and 2 bits of the address (b3 and b4) for word line predecoding (which is also word line selection in this example). Thus, using the notation which was previously employed, k is equal to 5, and i is equal to 2 for the ROM described in FIG. 2.

Those skilled in the art recognize that it is undesirable to leave any lines "floating" electrically, as a floating line might go to an unknown potential which may conflict with the proper operation of the circuit. Accordingly, the bit lines 34a-34h extend upward above the x-y memory array 12 into the bit line deselector 27 whose function is to connect the 3-to-4 bit lines which are not selected to a known positive chip potential.

In the embodiment of the invention shown in FIG. 2, the bit line deselector 27 connects the deselected bit lines 34 to a potential which is somewhat less than the highest positive chip potential, namely $V_{dd}$. In the present embodiment, deselected bit lines are connected to a voltage which is one diode drop, $V_D$, less than $V_{dd}$. The bit line deselector 27 is similar to the bit line selectors 26a, 26b in that the bit line deselector 27 is comprised of 4 polycrystalline silicon lines 46a-46d which overlie the bit lines 34a-34h. As previously described, the bit lines 34a-34h are comprised of P+ epitaxial silicon lines. However, beneath those intersections indicated by an "x", where one of the polycrystalline silicon deselector lines 46a-46d overlies one of the epitaxial silicon bit lines 34a-34h, the epitaxial silicon bit lines are doped to be of N— conductivity in order to form P-channel MOS transistors. Accordingly, the bit line deselector 27 acts like a 4-position switch which connects 3 out of each set of 4 bit lines to $V_{dd}-V_D$ in the present embodiment of the invention. The 3-of-4 bit lines which are connected to $V_{dd}-V_D$ are the 3 which the bit line selectors 26a, 26b would have otherwise left floating.

The bit line deselector 27 is operated by a bit line deselector address decoder 31. The bit line deselector address decoder 31 of the preferred embodiment of the invention has circuitry similar to the circuitry of the bit decoder 25, except that the NAND gates 40a-40d are replaced by NOR gates 54a-54d and the inverters 39a, 39b are connected to provide the NOR gates 54a-54d with inverted inputs relative to the inputs to the NAND gates 40a-40d, respectively, The word line deselector 17 in the embodiment of the invention shown in FIG. 2 connects the deselected word lines to the highest positive chip potential, namely Vdd. The word line deselector 17 is similar to the word line selector 18 in that the word line deselector 17 is comprised of 4 polycrystalline silicon lines 48a-48d which overlie the word lines 32a-32d. As previously described, the word lines 32a-32d of the x-y memory array 12 are comprised of N+ polycrystalline silicon lines. Accordingly, the ends of the word lines 32a-32d are connected through staggered metal contacts 50a-50d to P+ epitaxial silicon word line extensions 52a-52d, for reasons heretofore explained. Beneath those intersections indicated by an "x", where one of the polycrystalline silicon deselector lines 48a-48d overlies one of the epitaxial silicon word line extensions 52a-52d, the epitaxial silicon word line extensions are doped to be of N— conductivity in order to form P-channel MOS transistors. Accordingly, the word line deselector 17 acts like a 4-position switch which connects 3 out of each set of 4 word lines to the highest positive chip potential, namely $V_{dd}$. The 3-of-4 word lines which are connected to $V_{dd}$ are the 3 which the word predecoder 18 would have otherwise left floating.

The word line deselector 17 is operated by a word line deselector address decoder 29. Those skilled in the art will recognize that the circuitry for the word line deselector address decoder 29 of the preferred embodiment of the invention can be identical to the circuitry used for the bit line deselector address decoder 31. Similarly, the circuitry used for the bit decoder 25 can also be used for the word address decoder 19 in this particular embodiment.

As a specific example, in order to address the memory cell located at the intersection of word line 32b and bit line 34f, the 2 bits b3 and b4 are used to enable only word line extension 42b, while disabling word line extensions 42a, 42c, and 42d. Word line 32b is thereby connected to word output line 45. Similarly, the bit decoder 25, using bits b0 and b1, energizes the output of NAND gate 40b which in turn energizes bit predecoder line 36b while leaving the other bit predecoder lines 36a, 36c, and 36d disabled. Thus, bit line 34b is electrically connected to the predecoder output line 38a, the bit line 34f is simultaneously connected to the predecoder output line 38b. Bit b2 is then used to select only the output of bit predecoder 26b, thereby connecting predecoder output line 38b to the output 33 of bit decoder 30. Accordingly, if there is a diode present at the intersection of the word line 32b and bit line 34f, unidirectional current flow would now be possible. On the other hand, if no diode is present in the x-y memory array 12 at that intersection, then no current flow would be possible. The output lines 38a, 38b, are connected to $V_{dd}$ through load resistors, $R_L$.

The disabled word and bit lines 32a, 32c, and 32d, and 34a, 34c, 34d, 34e, 34g, and 34h, respectively, are all connected to $V_{dd}$ by the deselectors 17, 27, in the manner previously explained.

In order to "read" the content of the memory cell at the addressed memory location, an attempt is made to pass current through any diode that may be present, thereby trying to pass current from the bit decoder output line 33 to the word decoder output line 45. Whether or not that attempt is successful determines whether a "0" or a "1" will be read from the addressed memory cell.

As previously described, the ROM 10 of the present invention comprises an x-y memory array 12 which included $2^k$ memory cells. Each memory cell comprises an intersection of a word line and a bit line at which a buried contact diode is selectively formed (when the ROM is "programmed") as heretofore described.

In order to construct the ROM in accordance with the preferred embodiment of the invention, one starts with an insulating substrate upon which a single crystal semiconductor material can be grown, such as the sapphire substrate 60 shown in FIG. 3. On the sapphire substrate 60, a single crystal semiconductor layer 62, comprised of silicon in the preferred embodiment of the invention, is epitaxially grown. In the preferred embodiment of the invention, the silicon layer 62 has a surface parallel to the (100) plane of the crystallographic axis.

The substrate 60, with the epitaxial silicon layer 62 thereon, is placed into an oxidation furnace heated to about 1050 degrees Centigrade for a time sufficient to grow an oxide layer 64 having a thickness of about 1000 Angstroms on the surface of the silicon layer 62. Then, a photoresist layer 66 is applied to the surface of the silicon dioxide layer 64. Using a first photomask, the photoresist layer 66 is photolithographically defined, so it can be used to form the silicon layer 62 into the bit lines of the x-y memory array 12 and the extensions of the word lines which form part of the word predecoder circuitry and word line deselector circuitry heretofore described. Then, the defined photoresist layer 66 is developed and used as an etch mask to define the silicon dioxide layer 64. Typically, an etchant such as buffered hydrofluoric acid (HF) is used to remove the portions of the silicon dioxide layer 64 which are exposed through the etch mask. Then, the portions of the underlying silicon layer 62 which are exposed following the etch of the silicon dioxide layer 64 are removed by etching in a suitable etchant, such as potassium hydroxide (KOH). The etch of the exposed portions of the silicon layer 62 makes use of the previously etched silicon dioxide layer 64 as an etch mask, in order to thereby form the silicon layer 62 into islands where MOS transistors will be formed. Then, the remaining portions of the photoresist layer 66 are stripped to form the silicon layer 62 into the structure shown in FIG. 4.

The partially formed ROM 10 is then covered with a second layer of photoresist material which is defined in a second photolithographic step using a second photomask. The photoresist layer is defined to expose all of the N-channel transistors while covering all of the P-channel transistors. Acceptor ions, such as boron ions, are implanted into the N-channel MOS transistors in order to establish their threshold voltages. In the preferred embodiment of the invention, the acceptor ions are implanted at an energy level of about 70 KeV to a dosage of about $10^{12}$ ions per square centimeter. Then, the second photoresist layer is stripped, and the entire substrate is subjected to a non-selective implantation of a donor ion, such as phosphorus, at an energy of about 70 KeV to a dosage of about 10 ions per square centimeter in order to set the threshold voltage of he P-channel MOS transistors.

Next, all of the oxide is stripped off the partially formed ROM 10 which is then placed into an oxidation furnace heated to about 1000 degrees Centigrade for a time sufficient to grow oxide layers 68 to a thickness of about 700 angstroms on the exposed silicon surfaces, as shown in FIG. 4. The oxide layers 68 are shown on the defined silicon epitaxial layers, including the bit lines 34a–34h and the word line extensions 42a, 52a.

Referring now to FIG. 5, another photoresist layer 70 is applied over the surface of the wafer and a third photomask, called the "oversize buried contact mask", is used to define the layer 70. The defined photoresist layer 70 is used as an ion implantation mask which exposes the oxide layers 68 in all areas where buried contacts may be formed, i.e. the entire surface of the x-y memory array 12. The oxide is also exposed over those intersections in the word line deselectors 17, the word predecoders 18, the bit predecoders 26, and the bit line deselectors 27 whose no P-channel MOS transistors are desired, i.e. all of those intersections which are not shown with an "x" in FIG. 2. A deep P+ implantation of acceptor ions, such as boron ions (represented by the arrows in FIG. 5), is then carried out at an energy of about 70 KeV to a dosage of about $10^{13}$ ions per square centimeter through the oxide layers 68 into the epitaxial silicon. The deep P+ ion implantation serves to give the bit lines 34a–34h a P+ conductivity and to short out the P-channel MOS transistors which would otherwise be formed in the deselectors 17, 27 and the predecoder 18, 26 at the intersections not designated by "x's" in FIG. 2.

Another photoresist layer (not shown) is then applied over the existing photoresist layer 70, and a fourth photomask, called "the programming mask" or "the buried contact mask" is used to selectively expose areas of the oxide layers 68 where there will be intersections in the x-y memory array 12 and buried contact diodes will be formed. The newly defined photoresist layer is then developed and used as an etch mask to remove the exposed oxide layers 68 from the selected ones of the bit lines 34 in places where the bit lines will be crossed by the word lines and the buried contact diodes are desired, i.e. from the bit lines 34a, 34d, 34g, and 34h, as will be seen in FIG. 6. Both layers of photoresist which were on the wafer are then stripped.

Figure 6:
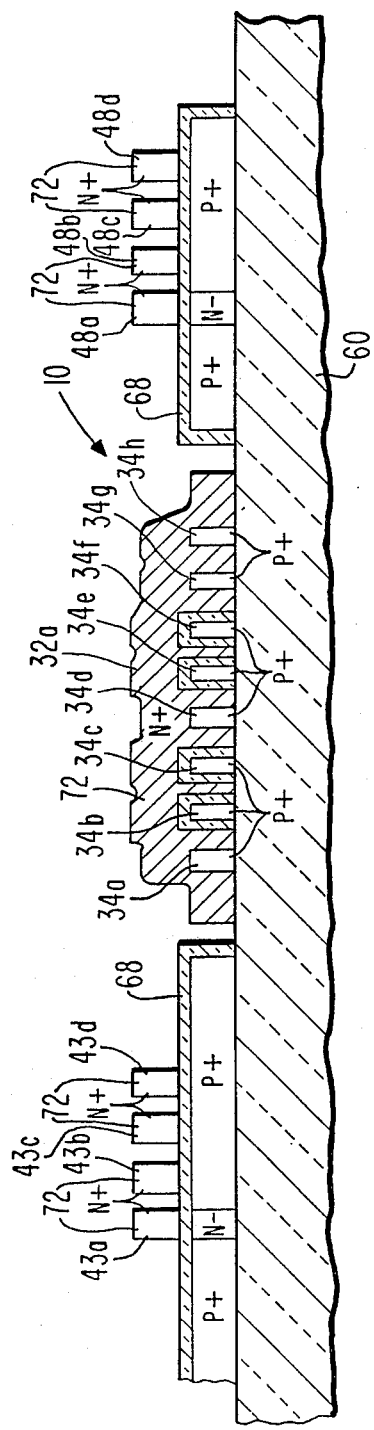

Next, a polycrystalline silicon layer 72 is deposited to a thickness of about 6500 Angstroms over the entire surface of the partially formed ROM 10 by any suitable process. The polycrystalline silicon layer 72 is doped to have an N+ conductivity, typically by using phosphorus oxychloride. As a result of the doping of the polycrystalline silicon layer 72, buried contact diodes will be formed between the layer 72 and those bit lines 34a, 34d, 34g, and 34h from which the oxide layer 68 had theretofore been removed, as shown in FIG. 6. Thus, the definition of the buried contact openings using the fourth photomask, serves to program the x-y memory array 12 of the ROM 10.

The polycrystalline silicon layer 72 is then covered by a new photoresist layer not shown which is used in a photolithographic step with a fifth photomask to define the polycrystalline silicon layer 72 into various word lines and predecoder lines. In addition, the polycrystalline silicon layer 72 is defined to form interconnects and gates of the logic circuitry which is included in the ROM 10. The logic circuitry includes the registers, line selectors, drivers, etc. well known in the art, as well as the decoders and predecoders described herein.

Following the definition of the polycrystalline silicon layer 72, as shown in FIG. 6, the P+ and N+ source and drain regions of the various transistors in the ROM 10 are formed using two additional photomasks and photolithography steps followed by standard ion implantation steps.

Figure 7:
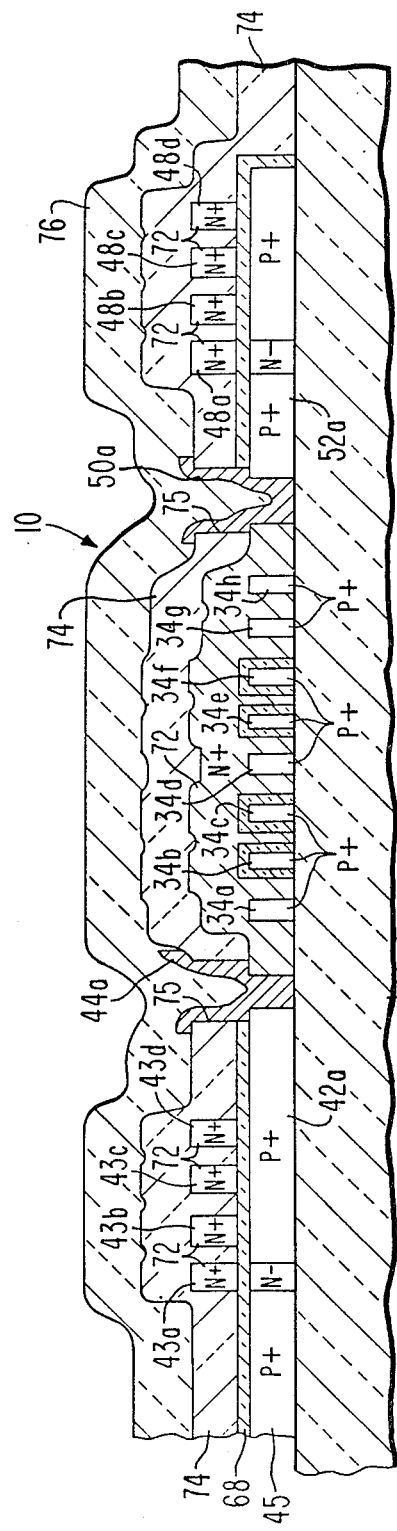

Then, a field oxide layer 74 is deposited over the surface of the partially formed ROM 10. Thereafter, openings 72 are photolithographically defined in the field oxide 74, and then the openings 75 are formed by etching. Next, a metal layer is applied over the surface of the partially completed ROM 10 and the metal layer is photolithographically defined to form interconnects and the staggered metal contacts 44a, 50a, as shown in FIG. 7. Finally, a protective oxide layer 76 is deposited over the surface of the entire ROM 10, and bond pad openings (not shown) are formed therein, thereby completing the ROM 10.

While the present invention has been described with reference to an SOS structure, those skilled in the art will recognize that a bulk silicon version of the ROM can easily be implemented by replacing the N+ doped silicon epitaxial silicon lines with N+ diffusions into a P type bulk silicon substrate. In view of the fact that all other aspects of the invention follow directly from the description of the invention relating to FIGS. 1 and 2, those skilled in the art will not require any additional explanation of the manner of implementing the ROM of the present invention in a bulk silicon structure.

While the preferred embodiment of the present invention has been described herein, those skilled in the art will recognize that many changes can be made to the preferred embodiment without departing from the spirit or scope of the invention. In particular, the ROM can be built in accordance with the present invention with the conductivity types of the various semiconductor regions reversed. Also, the number and layout of the memory cells in the x-y memory array can be changed. Thus, while a 32×1 ROM design was described, a 32K×8 ROM employing the present invention has been designed by the present inventors. Similarly, other changes, such as the substitution of metals, such as aluminum, for semiconductors, or the use of Schottky diodes in the x-y memory array are considered to be within the scope of the present invention. Thus, the semicondutor word lines can be replaced by metal word lines which form Schottky diodes in the x-y memory array with underlying semiconductor bit lines.

We claim:

1. A Read Only Memory (ROM) comprising a substrate
   (A) a high density memory array including:
      (1) a first plurality of substantially parallel lines of a semiconductor material of one conductivity type on said substrate,
      (2) a second plurality of substantially parallel lines of a material different from the semiconductor material of the first lines and said second lines crossing said first lines,
      (3) insulating means between said first and second lines and having openings therethrough at some of the intersections of the first and second lines so that at said intersections the second line contacts the first line to form a diode;
   (B) a line selector including:
      (1) a first plurality of substantially parallel lines of the same semiconductor material as the first lines of the memory array and of a given conductivity type, said first lines being of a number equal to the number of the second lines of the memory array;
      (2) a second plurality of substantially parallel conductive lines which are substantially perpendicular to and cross over the first lines of the selector, insulation between said first and second selector lines at each of their intersections, and the portion of each of the first selector lines at each of said intersections being of a conductivity type opposite to that of said given conductivity type to form a MOS transistor with the second line at each of said intersections; and
      (3) an output line connected to at least two of said first selector lines; and
   (C) means electrically connecting each of the first selector lines to a separate one of the second memory array lines and along one side of the memory array, said connecting means being separate metal contacts each extending between and overlapping an end of a first selector line and an end of a second line of the memory array with said metal contacts being staggered in the direction in which the parallel lines extend in order to enable said metal contacts to overlap the ends of said lines while occupying the minimum space necessary in a direction substantially perpendicular to the direction in which said substantially parallel semiconductor lines extend.

2. The Read Only Memory (ROM) of claim 1 wherein said substrate is a sapphire substrate and said first plurality of semiconductor lines is comprised of silicon.

3. The Read Only Memory (ROM) of claim 2 wherein the lines of said second plurality of lines of said high density memory array are substantially perpendicular to the lines of said first plurality of lines of said high density memory array.

4. The Read Only Memory (ROM) of claim 3 wherein said second plurality of lines of said high density memory array is comprised of doped polycrystalline silicon material having a conductivity type opposite that of said first plurality of lines of said high density memory array.

5. The Read Only Memory (ROM) of claim 4 wherein said means for selectively insulating comprise silicon dioxide areas selectively formed on said first plurality of lines of said high density memory array.

6. The Read Only Memory (ROM) of claim 1 wherein said substrate is of an insulating material and said first plurality of substantially parallel semiconductor lines of said apparatus for electrically connecting comprises a set of epitaxial, single crystal semiconductor lines formed on said insulating substrate.

7. The Read Only Memory (ROM) of claim 6 wherein said second plurality of substantially parallel lines are comprised of polycrystalline silicon.

8. The Read Only Memory (ROM) of claim 7 wherein said metal contacts are arranged in two rows which extend in a direction perpendicular to the direction in which said substantially parallel semiconductor lines extend, and adjacent ones of said metal contacts are placed in alternate ones of said rows, whereby said metal contacts will occupy the minimum space necessary in the direction in which said substantially perpendicular semiconductor lines extend.

* * * * *

UNITED STATES PATENT AND TRADEMARK OFFICE
CERTIFICATE OF CORRECTION

PATENT NO. : 4,419,741

DATED : December 6, 1983

INVENTOR(S) : Roger G. Stewart et al.

It is certified that error appears in the above-identified patent and that said Letters Patent is hereby corrected as shown below:

```
Column 3, line 47, after "selector" insert --select--.
Column 6, line 8, change "lins" to --lines--.
Column 7, line 3, change "to" to --for--.
Column 7, line 67, change "3-to-4" to --3-of-4--.
Column 9, line 33, change "included" to --includes--.
Column 10, line 42, change "whose" to --where--.
```

Signed and Sealed this

Fourteenth Day of February 1984

[SEAL]

Attest:

GERALD J. MOSSINGHOFF

Attesting Officer     Commissioner of Patents and Trademarks